United States Patent
Madhusudhana et al.

(10) Patent No.: US 7,243,289 B1
(45) Date of Patent: Jul. 10, 2007

(54) METHOD AND SYSTEM FOR EFFICIENTLY COMPUTING CYCLIC REDUNDANCY CHECKS

(75) Inventors: Honnuduke S. Madhusudhana, Bangalore (IN); Rakesh Kumar Bhatia, Kanpur (IN); Shyamsundar Ranganathan, Bangalore (IN)

(73) Assignee: Novell, Inc., Provo, UT (US)

( * ) Notice: Subject to any disclaimer, the term of this patent is extended or adjusted under 35 U.S.C. 154(b) by 920 days.

(21) Appl. No.: 10/351,181

(22) Filed: Jan. 25, 2003

(51) Int. Cl.
*H03M 13/00* (2006.01)
(52) U.S. Cl. .................. 714/758; 714/807; 714/776
(58) Field of Classification Search .............. 714/758, 714/718, 801, 807, 766, 751, 746, 800, 755, 714/722, 765, 776
See application file for complete search history.

(56) References Cited

U.S. PATENT DOCUMENTS

| | | | |
|---|---|---|---|
| 5,951,707 A | | 9/1999 | Christensen et al. |
| 6,047,304 A | * | 4/2000 | Ladwig et al. ............. 708/530 |
| 6,061,822 A | * | 5/2000 | Meyer ....................... 714/758 |
| 6,128,766 A | | 10/2000 | Fahmi et al. |
| 6,240,540 B1 | | 5/2001 | Jones et al. |
| 6,279,140 B1 | * | 8/2001 | Slane ......................... 714/807 |
| 6,357,032 B1 | | 3/2002 | Plotz et al. |
| 6,438,724 B1 | | 8/2002 | Cox et al. |
| 6,446,234 B1 | | 9/2002 | Cox et al. |
| 6,530,057 B1 | | 3/2003 | Kimmitt |
| 6,553,388 B1 | * | 4/2003 | Perks ........................ 707/201 |
| 6,775,802 B2 | * | 8/2004 | Gaal .......................... 714/758 |
| 6,851,086 B2 | * | 2/2005 | Szymanski ................. 714/781 |
| 6,964,008 B1 | * | 11/2005 | Van Meter, III ............ 714/807 |
| 7,111,207 B2 | * | 9/2006 | Sakai ......................... 714/701 |

OTHER PUBLICATIONS

Sarwate, D.V., *Computation of Cyclic Redundancy Checks Via Table Look-up*, Communications of the ACM 31 (8), Aug. 1986, pp. 1008-1013.
Rao, T.R.N. and Fujiwara, E., *Error-Control Coding for Computer Systems*, Prentice-Hall, 1989.
Johnson, Eric E., *High-Speed Computation of Cyclic Redundency Checks*, New Mexico State University, NMSU-ECE-95-011, Nov. 1995.
Scott, Ruffin, *Understanding Cyclic Redundancy Check*, Mar. 3, 1999.

* cited by examiner

*Primary Examiner*—Guy Lamarre
*Assistant Examiner*—Fritz Alphonse
(74) *Attorney, Agent, or Firm*—Haynes and Boone, LLP

(57) ABSTRACT

A method and system is provided for computing a final cyclic redundancy check (CRC) checksum for an entire data block. The method includes segmenting the data block into at least first and second segments and calculating a partial CRC for each segment. A residue table T is calculated that has 'R' entries, where the CRC is R-bits in length. An effective CRC is initialized and the entries of the residue table corresponding to nonzero bits of the partial CRC of the first segment are summed. The final CRC for the data block is computed as the sum of the effective CRC and the partial CRC of the second segment.

20 Claims, 2 Drawing Sheets

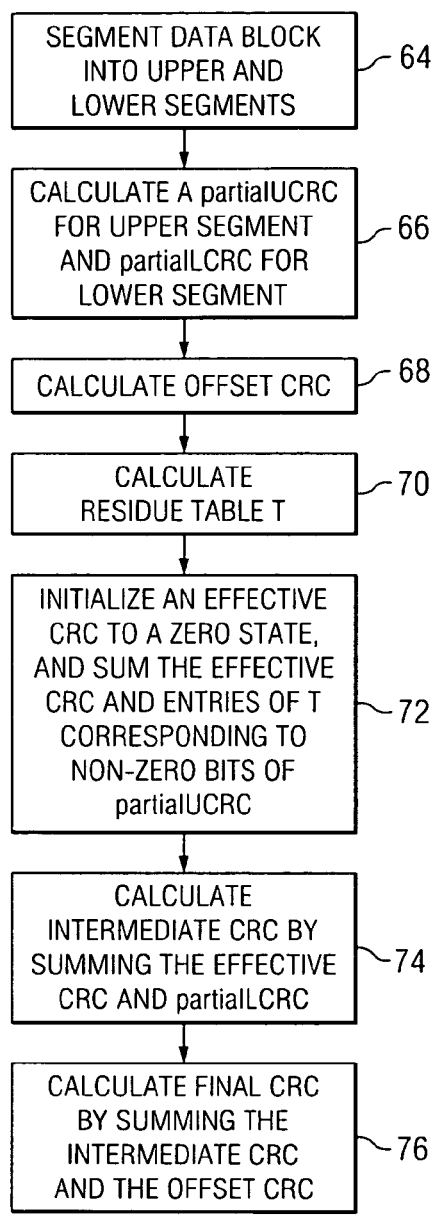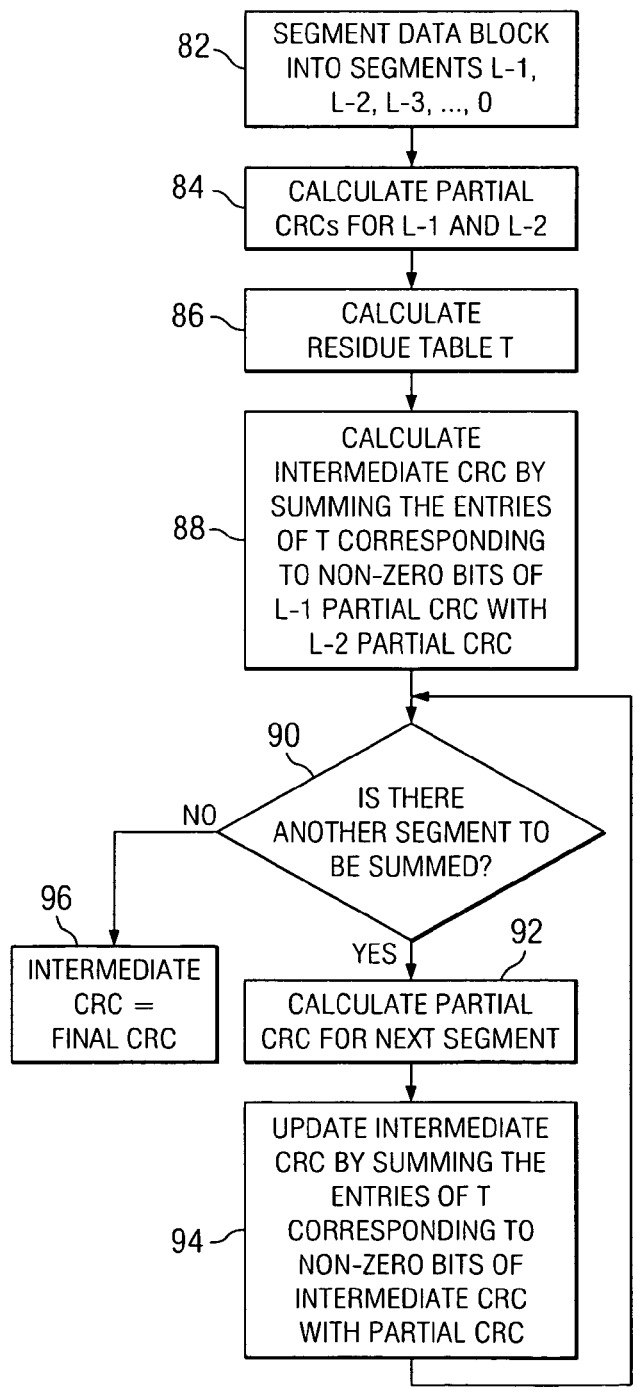

METHOD AND SYSTEM FOR EFFICIENTLY COMPUTING CYCLIC REDUNDANCY CHECKS

BACKGROUND

This disclosure relates generally to error checking in digital systems and, more specifically, to a method and system for efficiently computing cyclic redundancy checks on data in a digital system.

Error checking is commonly used in digital communications, file back-up systems, and storage systems to verify that a message or file is free from errors (e.g., that the message or file being checked corresponds to the original message or file). One method for detecting such errors is to employ a cyclic redundancy check (CRC). The CRC performs a mathematical calculation on a block of data (e.g., the message or file) and returns a number (a "checksum") that represents the content and organization of that data. The basic idea is to have the CRC return a checksum that uniquely identifies the data.

CRCs are widely used for a number of reasons. For example, a CRC is a fixed-length checksum (typically sixteen or thirty-two bits), data for which a CRC can be calculated can be of arbitrary length, there is a dependency on data order for computing a CRC, CRC is linear, and a CRC computation is of reasonable computational complexity.

In a digital communications system, a CRC may be used as follows. A data stream in a digital communications system consists of headers and data packets. As the data arrives at a source node, a CRC checksum is computed for the data and transmitted along with the data. A target node, upon reception of the data, independently generates the CRC checksum and compares the generated CRC checksum with the CRC checksum received from the source node. An exact match between the independently generated CRC checksum and the received CRC checksum indicates that there were no errors in the transmission. If the checksums do not match, an error is assumed to have occurred.

In file processing, CRC may be used as follows. An entire data file is considered as a data block for which a CRC checksum is calculated. The CRC checksum is stored along with the data. When the file data is restored, the CRC checksum is independently computed and checked against the pre-stored CRC checksum to check for errors. As in the case of communication systems, a CRC checksum match indicates that there were no errors in storage, whereas a mismatch indicates that an error occurred.

Generally, the CRC computation on a data block is accomplished in a serial manner and the entire data block has to be available. By using the linearity property of CRC, the computation may be made more efficient by pre-computing CRC tables, whose entries contain pre-computed effects on the CRC for any n-bit data, where n is usually 4, 6, or 8 bits. However, look-up tables become less desirable with increasing table index 'n', because they grow exponentially as $2^n$ entries. Furthermore, there are situations where the entire data block for which the CRC is to be computed is not simultaneously available and the CRC checksum needs to be calculated on segments of the data block. This is generally accomplished by either employing data buffering to do the CRC computations, which results in processing delays, or computing the CRC checksum using alternative methods, such as computing a checksum for each data segment and then combining the data segments' checksums to obtain a final checksum.

Data buffering is often undesirable because it may affect performance (e.g., it requires additional read/write time to and from memory) and generally adds complexity to the CRC computations. Data buffering also requires that all the data for which the CRC needs to be computed is available before the computation starts, which slows down the receiving process that is waiting for the data. Some current methods for computing CRC checksums for multiple data segments and then combining them require constantly updating the CRC checksum while processing the CRC for each data segment, which adds computational complexity to the CRC computations. Other methods that compute CRC checksums for multiple data segments often use multiplication and polynomial division to obtain the final CRC checksum, which requires additional time and computational resources.

Therefore, what is needed is a method and system for efficiently computing CRCs on data in a digital system. For example, it is desirable to compute a CRC checksum for multiple segments and then to efficiently obtain a final CRC checksum.

SUMMARY

In response to these and other problems, a method and system is provided for calculating a final checksum for data in a digital system, where the data comprises at least first and second data segments. The method comprises calculating a first partial checksum for the first data segment and a second partial checksum for the second data segment. A residue table having a plurality of elements is created. At least one element from the residue table is combined with an effective checksum, where the at least one element is selected based on a value associated with the first partial checksum. The final checksum is calculated by combining the effective checksum and the second partial checksum.

BRIEF DESCRIPTION OF THE FIGURES

FIG. 4 illustrates another embodiment of the method of FIG. 3.

FIG. 5 is a flowchart illustrating a method for computing a cyclic redundancy check for a data block divided into a plurality of data segments.

DETAILED DESCRIPTION

Figure 1:
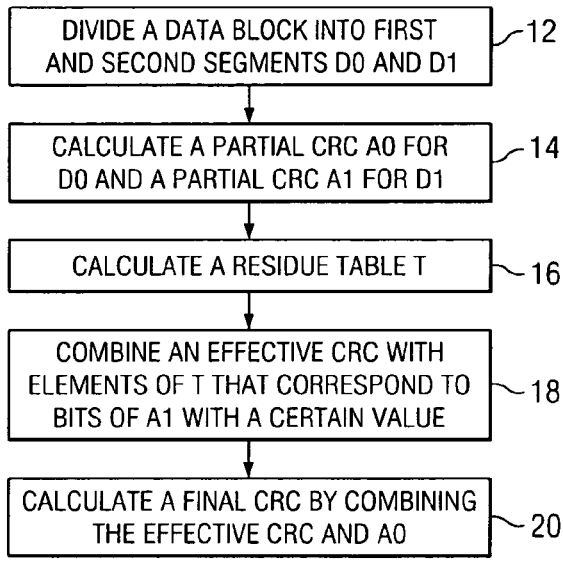
FIG. 1 is a flowchart illustrating a method for efficiently computing a checksum for a data block.

The present disclosure relates generally to error checking in digital systems and, more specifically, to a method and system for efficiently computing cyclic redundancy checks on data in a digital system. It is understood, however, that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a method 10 illustrates one embodiment in which a final cyclic redundancy check (CRC) checksum is obtained for an entire data block by using partial CRCs computed for data block segments. The method 10 combines the partial CRCs using one or more residue tables, but without using multiplication and division. This enables the method 10 to perform the CRC computation in an efficient manner.

The method 10 begins in step 12 by segmenting the data block (which comprises 2N bits) into two segments D0 and D1, which are each N bits in length. In step 14, a partial CRC is calculated for each segment, where A0 is the partial CRC of D0, and A1 is the partial CRC of D1. Both A0 and A1 are of length 'R' bits. A residue table T is calculated in step 16, as will be described later in greater detail. The residue table T has 'R' entries corresponding to CRCs of $x^N, x^{N+1}, \ldots,$ up to $x^{N+R-1}$.

In step 18, an effective CRC for segment D1 is initialized as zero, and the entries of T corresponding to non-zero bits of A1 are summed. This means that if the least significant bit of A1 is 1, then the first entry of T is added to the effective CRC. If the least significant bit of A1 is 0, it is not added. Similarly, if the second least significant bit of A1 is 1, then the second entry of T is added; otherwise the second entry is not added. This is done sequentially for each bit of A1. Once the bits have been combined, the final CRC for the data block is computed in step 20 by combining the effective CRC (as computed in step 18) and A0.

Figure 2:
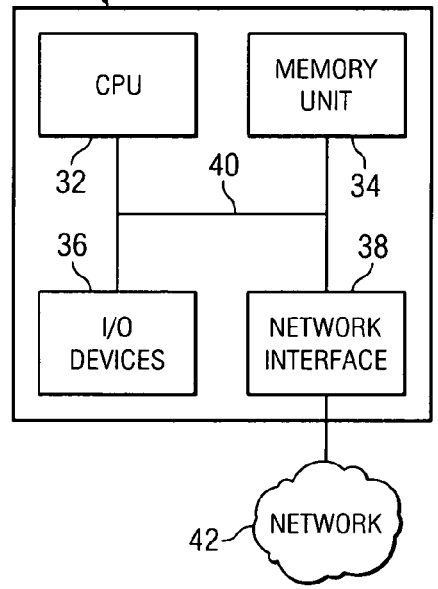
FIG. 2 is a diagram of an exemplary computer that may be used to execute the method of FIG. 1.

Referring now to FIG. 2, in another embodiment, an exemplary computer 30, such as may be used to implement the method 10 of FIG. 1, is illustrated. The computer 30 may include a central processing unit ("CPU") 32, a memory unit 34, an input/output ("I/O") device 36, and a network interface 38. The components 32, 34, 36, and 38 are interconnected by a bus system 40. It is understood that the computer may be differently configured and that each of the listed components may actually represent several different components. For example, the CPU 32 may actually represent a multi-processor or a distributed processing system; the memory unit 34 may include different levels of cache memory, main memory, hard disks, and remote storage locations; and the I/O device 36 may include monitors, keyboards, and the like.

The computer 30 may be connected to a network 42. The network 42 may be representative of several networks, such as a local area network, a company wide intranet, and/or the Internet. Because the computer 30 may be connected to the network 42, certain components may, at times, be shared with other computers (not shown). Therefore, a wide range of flexibility is anticipated in the configuration of the computer. Furthermore, it is understood that, in some implementations, the computer 30 may act as a server to other computers.

The computer 30 may utilize one or more architectures, such as Storage Management Services (SMS) by Novell. SMS is an open architecture that defines the manner in which storage management products, such as Novell's SBACKUP utility, access and store information for backup and restoration. Existing CRC computation processes may be inadequate for some architectures. For example, some architectures read files in a serial fashion, which makes the computation of a CRC checksum serial. In other words, a CRC for a first chunk of data is read from a file, stored in a running CRC, and fed into the computation of the next chunk of data read from the file. In such an architecture, the running CRC is the CRC of the data, read up to that point, from the file.

Other architectures may utilize multiple threads to read different parts of the file's data. In these architectures, each chunk of data is read independently of the others and using a running CRC does not work because of its serial nature. In these architectures, a final CRC for a file should be computed using individual CRCs (e.g., partial CRCs) that correspond to each of the chunks read. At any given point of time, the partial CRCs for data chunks that have been read are available. When the last chunk of data is read from the file, the partial CRCs need to be merged into the final CRC. Furthermore, the final CRC should be equal to a CRC that would have computed for the same file in a serial manner.

As will be described in greater detail and with specific examples, the present disclosure provides a way of efficiently merging individual CRCs. The merging of the individual CRCs results in a final CRC that is the same as the final CRC that would be computed using a serial method. Accordingly, parallel computation of CRCs of different chunks of data may occur without having to wait for the CRCs of the previous chunks. In addition, different block sizes may be used and properly merged.

The computer 30 may be used to perform CRC computations on data stored on the memory unit 34, data transferred over the network 42, or any other data for which a CRC checksum is desired. In general, the operation of CRC computations may be described using polynomials. For example, a CRC checksum may be computed for an input block of data by treating the block as a string of binary coefficients of a polynomial. The polynomial is divided by a predefined "generator polynomial" and the remainder of this division is used as the CRC checksum.

To accomplish this, the data is represented as N data bits $i_{N-1} \ldots i_0$, in which $i_{N-1}$ is the first bit to be processed. The associated data polynomial is $i(x)=x^r(i_{N-1}*x^{N-1}+i_{N-2}*x^{N-2}+ \ldots +i_1*x+i_0)$, where 'r' is the degree of the generator polynomial $g(x)=x^r+g_{r-1}x^{r-1}+g_{r-2}x^{r-2}+ \ldots +g_1x+g_0$. The relationship between i(x) and g(x) may be expressed as:

$$i(x)=q(x)g(x)+r(x) \qquad \text{Eq. 1}$$

for some quotient polynomial q(x). Note that r(x), as the remainder of i(x) divided by g(x), is of order r−1 or less, and can be represented by a string of r bits.

CRC polynomials are frequently of degree 16 or 32. For example, a standard 32 bit generating polynomial is defined for the Autodin II and Ethernet RTM standard, as well as in the American National Standard for FDDI Media Access Control. This standard generator is $g(X)=(x^{32}+x^{26}+x^{23}+x^{22}+x^{16}+x^{12}+x^{11}+x^{10}+x^8+x^7+x^5+x^4+x^2+x+1)$. The $x^{32}$ element of the standard CRC polynomial g(x) should have both a constant term and a coefficient equal to one.

An efficient approach to CRC computation in software makes use of a look-up table, called a CRC_Table, whose entries contain pre-computed effects on the CRC for n-bit data, where n is usually 4, 6, or 8 bits. The table enables later CRC computations to run at one cycle per n-bits (instead of one cycle per bit). The CRC_Table is indexed by n-bits and contain words of length 'r' that represent the composite effect of processing entire n-bits of data through the polynomial division algorithm as described previously. The table is indexed by the contents of the byte to be processed, and therefore contains 16, 64, or 256 entries depending on n. While extensively used, the main limitation of this approach is that the size of the CRC_Table grows exponentially with n.

Figure 3:
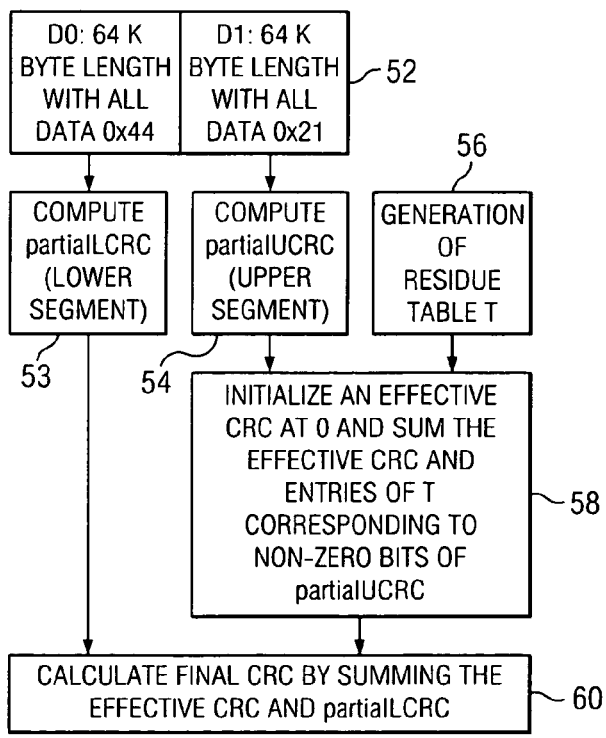
FIG. 3 is a flowchart illustrating a method for computing a cyclic redundancy check for a data block divided into two segments.

Referring now to FIG. 3, in another embodiment, a method 50 uses a residue table to combine partial CRCs without using multiplication and division. A CRC checksum is to be calculated from the partial CRCs. It is assumed that the data is partitioned and that the partial CRCs may be computed on the partitioned data using any of a plurality of methods, such as bit-by-bit processing, parallel table look-up, or hardware processing.

In the present example, a CRC checksum is to be calculated for a data block of 128*1024 (128 KB)=131072 bytes. The data block, for example, may be stored in a memory buffer. For the purposes of this example, the memory buffer has the upper significant 64 K bytes set to 0x21 and the lower significant 64 K bytes set to 0x44. The method 50 begins in step 52 by segmenting the data block into two segments D0, D1 that correspond to lower and upper blocks of N bits in length, respectively, where N=65536. The generation polynomial for the CRC computation is the standard polynomial described above, namely, $g(x)=(x^{32}+x^{26}+x^{23}+x^{22}+x^{16}+x^{12}+x^{11}+x^{10}+x^8+x^7+x^5+x^4+x^2+x+1)$.

In steps 53 and 54, a partial CRC is computed for each of the upper and lower 64 KB blocks. The partial CRCs are designated partialUCRC for the upper block and partialLCRC for the lower block. For purposes of example, the CRC computations result in the partialUCRC being equal to 0xD3C031EA and the partialLCRC being equal to 0x6B0ABE69.

The residue table T is calculated in step 56. The residue table T has 'R' elements corresponding to CRCs of $x^N$, $x^{N+1}$, ..., up to $x^{N+R-1}$. The elements are remainders that correspond to $x^{65536}$ modulo g(x), $x^{65537}$ modulo g(x), $x^{65538}$ modulo g(x), ..., up to $x^{65567}$ modulo g(x), which are calculated and stored in the table. As the generator polynomial g(x) of the present example is a thirty-two degree polynomial, the residue table T includes thirty-two elements (e.g., R=32). Each of the exponentiations needed to find the remainders is only calculated once (e.g., thirty-two exponentiations are performed to create the residue table). In the present example, the residue table T comprises the following remainders.

| T[32] = { | | | |
|---|---|---|---|
| 0x31FEC169 | 0xF547E394 | 0x7AA3F1CA | 0x3D51F8E5 |
| 0xF3107F52 | 0x79883FA9 | 0xD17C9CF4 | 0x68BE4E7A |
| 0x345F273D | 0xF79710BE | 0x7BCB885F | 0xD05D470F |
| 0x859620A7 | 0xAF739373 | 0xBA014A99 | 0xB0B8266C |
| 0x585C1336 | 0x2C2E099B | 0xFBAF87ED | 0x906F40D6 |
| 0x4837A06B | 0xC9A35315 | 0x89692AAA | 0x44B49555 |
| 0xCFE2C98A | 0x67F164C5 | 0xDE403142 | 0x6F2018A1 |
| 0xDA288F70 | 0x6D1447B8 | 0x368A23DC | 0x1B4511EE } |

In step 58, an effective CRC is initialized as zero, and the elements of T corresponding to non-zero bits of the partialUCRC are summed with the effective CRC. As the partialUCRC is 0xD3C031EA (e.g., 1101 0011 1100 0000 0011 0001 1110 1010 in binary), the elements to be summed are T[0]+T[1]+T[3]+T[6]+T[7]+T[8]+T[9]+T[18]+T[19]+T[23]+T[24]+T[25]+T[26]+T[28]+T[30], and their summation results in the effective CRC equaling 0x36675DDA. It should be noted that this avoids multiplication and division operations and replaces them with only table look-up operations.

Once the effective CRC has been calculated, the final CRC for the data block is computed in step 60 by summing the effective CRC (as computed in step 58) and the partialLCRC. This summation results in a final CRC=0x6B0ABE69 EXOR 0x36675DDA=0x5D6DE3B3.

In this manner, a CRC checksum can be obtained for an entire data block by using partial CRCs.

The operation of the method 50 may be illustrated more generally as follows. Let $i(x)=i_0(x)+x^N i_1(x)$ represent the data polynomial having 2N bits. The parts $i_0(x)$ and $i_1(x)$ are of degree at most N-1. Let c(x)=CRC(i(x)). The degree of the CRC polynomial is denoted by R. Applying the linearity property of CRC results in $$a(x)=CRC[i_0(x)+x^N i_1(x)]=CRC[i_0(x)]+CRC[x^N i_1(x)]$$
$$=c_0(x)+CRC[x^N c_1(x)]$$ 
Eq. 2

Note that the term $x^N$ remains unaltered.

The term $x^N c_1(x)$ may be expanded as follows:

$$x^N c_1(x)=c_{1,0}x^N+c_{1,1}x^{N+1}+\ldots+c_{1,R-1}x^{N+R-1}$$ 
Eq. 3

Applying the linearity property results in $$CRC[x^N c_1(x)]=CRC[c_{1,0}x^N]+CRC[c_{1,1}x^{N+1}]+\ldots$$
$$+CRC[c_{1,R-1}x^{N+R-1}]$$ 
Eq. 4

Because $c_{1,i}$ is '0' or '1' (in the present binary system), Eq. 4 can be rewritten as $$CRC[x^N c_1(x)]=c_{1,0}CRC[x^N]+c_{1,1}CRC[x^{N+1}]+\ldots$$
$$+c_{1,R-1}CRC[x^{N+R-1}].$$ 
Eq. 5

Accordingly, by storing CRCs or remainders corresponding to $x^N$, $x^{N+1}$ and so on up to $x^{N+R-1}$, the remainder of $x^N c_1(x)$ may be computed as an EXOR addition.

Referring now to FIG. 4, in yet another embodiment, a method 62 computes a final CRC checksum with CRC initialized to a non-zero state (unlike the previous example of FIG. 3, where the CRC was initialized to zero). In the present example, the CRC computation may be modeled using an offset polynomial o(x), where the data polynomial is $$i(x)=i_0(x)+x^N i_1(x)+x^{2N} o(x)$$ 
Eq. 6 and $$CRC[i(x)]=CRC[i_0(x)+x^N i_1(x)]+CRC[x^{2N} o(x)].$$ 
Eq. 7

The offset polynomial o(x) may be selected, for example, by setting all the values of a CRC register to ONE before starting CRC computations. In this case, for a 32-bit CRC, $o(x)=(x^{32}-1)/(x-1)$ (all ONEs) will have thirty-two non-zero terms.

Beginning in step 64, the method 62 segments the data block into upper and lower segments and calculates a partial CRC for each segment (partialUCRC and partialLCRC, respectively) in step 66. A residue table T and an offset CRC (e.g., the CRC corresponding to CRC[x2No(x)]) are computed in steps 68 and 70. In step 72, an effective CRC is initialized to zero state and summed with the elements of T corresponding to non-zero bits of the partialUCRC. An intermediate CRC is calculated in step 74 by summing the effective CRC with the partialLCRC. The final CRC is then calculated in step 76 by summing the intermediate CRC with the offset CRC.

Referring now to FIG. 5, in still another embodiment, a method 80 is operable to calculate a final CRC for multiple segments of length N (rather than only two segments as previously described) designated as L-1, L-2, ..., 0, where L is the total number of segments. The multiple segments result in a data polynomial $$i(x)=i_0(x)+x^N i_1(x)+ \ldots x^{N*L-1} i_{L-1}(x) \quad \text{Eq. 8}$$

which can be expressed as $$i(x)=(i_0(x)+x^N(i_1(x)+ \ldots +(i_{L-3}(x)+x^N(i_{L-2}(x)+x^N i_{L-1}(x))\ldots)\ldots)\ldots). \quad \text{Eq. 9}$$

In steps 82 and 84, the method 10 divides data into multiple segments L−1, L−2, . . . , 0, and calculates partial CRCs for segments L−1 and L−2. A residue table T is computed in step 86. In the present example, the segments L−1 and L−2 represent inner nested segments, but it is understood that segments may be selected as desired. In step 88, an intermediate CRC is computed by summing the L−2 and L−1 segments using the residue table T as has been previously described. In step 90, a determination is made as to whether another segment remains to be summed. If the intermediate CRC includes all segments, then the method 80 continues to step 96 and equates the intermediate CRC with the final CRC.

If other segments remain to be summed, a partial CRC is calculated for the next segment (e.g., L−3) in step 92. The intermediate CRC is updated by combining the intermediate CRC with the partial CRC for the L−3 segment in step 94 using the residue table T as has been previously described (e.g., elements of the residue table T that correspond to desired values of the intermediate CRC are combined with the L−3 partial CRC). The process then returns to step 90 to determine if further segments remain to be summed. As illustrated, this process can be performed iteratively (e.g., by using Horn's rule). By storing the residue table, the computations are simplified and the final CRC may be efficiently calculated.

While the preceding description shows and describes one or more embodiments, it will be understood by those skilled in the art that various changes in form and detail may be made therein without departing from the spirit and scope of the present disclosure. For example, although many of the calculations in the preceding embodiments involve summing, it is understood that other calculations may be performed to reach the same result. Therefore, the claims should be interpreted in a broad manner, consistent with the present disclosure.

What is claimed is:

1. A method for calculating a final checksum for data in a digital system, wherein the data comprises at least first and second data segments, the method comprising:
   calculating a first partial checksum for the first data segment and a second partial checksum for the second data segment;
   creating a residue table having a plurality of elements;
   combining at least one element from the residue table with an effective checksum, wherein the at least one element is selected based on a value associated with the first partial checksum; and
   calculating the final checksum by combining the effective checksum and the second partial checksum.

2. The method of claim 1 wherein the elements of the residue table are calculated by performing CRC computations based on at least one predefined value.

3. The method of claim 2 wherein the predefined value is based on a polynomial, wherein the degree of the polynomial is associated with the length of the second data segment.

4. The method of claim 1 wherein each of the plurality of elements is associated with at least one bit of the first partial checksum.

5. The method of claim 4 wherein combining the at least one element from the residue table with the effective checksum comprises:
   identifying each bit of the first partial checksum that corresponds to the value; and
   combining the plurality of elements that are associated with the identified bits, wherein the effective checksum will include the combined elements.

6. The method of claim 5 further comprising initializing the effective checksum to zero.

7. The method of claim 6 wherein the value is non-zero.

8. The method of claim 5 further comprising computing an offset checksum.

9. The method of claim 8 further comprising initializing the effective checksum to zero.

10. The method of claim 9 further including combining the offset checksum with the final checksum, wherein the final checksum is not correct until it is combined with the offset checksum.

11. The method of claim 1 wherein each element of the table is calculated only once.

12. A method for calculating a final checksum for data in a digital system, wherein the data comprises at least first and second data segments, the method comprising:
   calculating a first partial checksum for the first data segment and a second partial checksum for the second data segment, wherein each of the first and second partial checksums comprise a plurality of values;
   creating a residue table having a plurality of elements, wherein each element corresponds to one of the plurality of values comprising the first partial checksum;
   identifying one or more of the plurality of values of the first partial checksum matching a predetermined number;
   calculating a first effective checksum based on the element corresponding to the identified one or more values comprising the first partial checksum; and
   calculating the final checksum by combining the first effective checksum and the second partial checksum.

13. The method of claim 12 wherein calculating the first effective checksum includes summing all elements that correspond to the identified one or more values.

14. The method of claim 12 wherein a length of the first partial checksum is R bits and a size of the first data segment is N bits, and wherein creating the residue table includes:
   calculating R elements for the residue table, wherein each of the R elements is unique and corresponds to a single remainder of $x^N, x^{N+1}, \ldots, x^{N+R-1}$.

15. The method of claim 12 further comprising:
   calculating a third partial checksum for a third data segment;
   identifying one or more of a plurality of values comprising the final checksum that matches the predetermined number, wherein each element of the residue table corresponds to one of the plurality of values comprising the final checksum;
   calculating a second effective checksum based on the element corresponding to the identified one or more values comprising the final checksum; and
   recalculating the final checksum by combining the second effective checksum and the third partial checksum.

16. The method of claim 15 wherein the data in the digital system includes i data segments, wherein i is an integer greater than or equal to five, and wherein the final checksum is recalculated for each of the fourth through $i^{th}$ data segments.

17. The method of claim 12 wherein combining the first effective checksum and the second partial checksum includes:
   identifying one or more values of the second partial checksum matching the predetermined number, wherein each element corresponds to one of the plurality of values comprising the second partial checksum; and
   summing the first effective checksum with the element corresponding to the identified one or more values comprising the second partial checksum.

18. A computer readable medium having a plurality of instructions stored thereon, the instructions for calculating a final checksum for digital data using cyclic redundancy check (CRC) computations, wherein the digital data can be divided into at least first and second data segments, the instructions comprising:
   calculating a first CRC checksum for the first data segment and calculating a second CRC checksum for the second data segment, wherein each of the first and second CRC checksums comprise a plurality of bits;
   calculating a plurality of elements, wherein each element is associated with one of the bits;
   identifying at least a first bit within the first CRC checksum that contains a predefined value;
   calculating an intermediate CRC checksum by summing an initialized checksum with the element associated with the identified first bit; and
   calculating the final checksum by combining the intermediate checksum with the second CRC checksum.

19. The computer readable medium of claim 18 further comprising instructions for creating a table containing the plurality of elements, wherein the size of the table is associated with the plurality of bits comprising the first CRC checksum.

20. The computer readable medium of claim 18 wherein combining the intermediate checksum with the second CRC checksum includes:
   identifying at least a second bit within the second CRC checksum that contains the predefined value; and
   summing the intermediate checksum with the element associated with the identified second bit.

* * * * *